United States Patent
Tsai et al.

(10) Patent No.: US 8,557,692 B2
(45) Date of Patent: Oct. 15, 2013

(54) FINFET LDD AND SOURCE DRAIN IMPLANT TECHNIQUE

(75) Inventors: Chun Hsiung Tsai, Xinpu Township (TW); Chien-Chang Su, Kaohsiung (TW); Tsung-Hung Li, Hsin-Chu (TW); Da-Wen Lin, Hsin-Chu (TW); Wen-Sheh Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 678 days.

(21) Appl. No.: 12/686,246

(22) Filed: Jan. 12, 2010

(65) Prior Publication Data

US 2011/0171795 A1  Jul. 14, 2011

(51) Int. Cl.
*H01L 21/40* (2006.01)
*H01L 21/02* (2006.01)

(52) U.S. Cl.
USPC ........................................ 438/541; 257/611

(58) Field of Classification Search
USPC ........... 257/408, 611, 335–346; 438/540–541
See application file for complete search history.

(56) References Cited

U.S. PATENT DOCUMENTS

| | | | |
|---|---|---|---|
| 4,169,740 A * | 10/1979 | Kalbitzer et al. | 438/527 |
| 6,238,967 B1 * | 5/2001 | Shiho et al. | 438/244 |
| 6,706,571 B1 | 3/2004 | Yu et al. | |
| 6,858,478 B2 | 2/2005 | Chau et al. | |
| 7,112,495 B2 * | 9/2006 | Ko et al. | 438/300 |
| 7,135,738 B2 * | 11/2006 | Williams et al. | 257/328 |
| 7,144,796 B2 * | 12/2006 | Dietz et al. | 438/545 |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 7,674,669 B2 * | 3/2010 | Hanafi | 438/206 |
| 8,138,053 B2 * | 3/2012 | Utomo et al. | 438/300 |
| 2004/0097041 A1 * | 5/2004 | Mandelman et al. | 438/270 |
| 2005/0153490 A1 | 7/2005 | Yoon et al. | |
| 2005/0214982 A1 | 9/2005 | Wu | |
| 2007/0120156 A1 | 5/2007 | Liu et al. | |
| 2007/0122953 A1 | 5/2007 | Liu et al. | |
| 2007/0122954 A1 | 5/2007 | Liu et al. | |

(Continued)

FOREIGN PATENT DOCUMENTS

| CN | 101438399 A | 5/2009 |
|---|---|---|
| EP | 1 860 683 A2 | 11/2007 |
| TW | 2009 15565 A | 4/2009 |

OTHER PUBLICATIONS

Office Action from Taiwan Patent Office for Application No. 10220243470, Applicant Taiwan Semiconductor Manufacturing Co., Ltd., mailed Feb. 26, 2013, 8 pages.

*Primary Examiner* — Calvin Lee
(74) *Attorney, Agent, or Firm* — Slater & Matsil, L.L.P.

(57) ABSTRACT

A method of forming an integrated circuit includes providing a semiconductor wafer; and forming a fin field-effect transistor (FinFET) including implanting the semiconductor wafer using a hot-implantation to form an implanted region in the FinFET. The implanted region comprises a region selected from the group consisting essentially of a lightly doped source and drain region, a pocket region, and a deep source drain region.

18 Claims, 8 Drawing Sheets

(56) References Cited

U.S. PATENT DOCUMENTS

| | | |
|---|---|---|
| 2007/0128782 A1 | 6/2007 | Liu et al. |
| 2007/0132053 A1 | 6/2007 | King et al. |
| 2007/0257315 A1 | 11/2007 | Bedell et al. |
| 2008/0042078 A1 | 2/2008 | England et al. |
| 2008/0290470 A1 | 11/2008 | King et al. |
| 2008/0296632 A1 | 12/2008 | Moroz et al. |
| 2009/0065853 A1 | 3/2009 | Hanafi |
| 2009/0181477 A1 | 7/2009 | King et al. |

* cited by examiner

FINFET LDD AND SOURCE DRAIN IMPLANT TECHNIQUE

TECHNICAL FIELD

This disclosure relates generally to integrated circuit devices and more particularly to methods for manufacturing fin field-effect transistors (FinFETs).

BACKGROUND

Transistors are core devices of integrated circuits. The formation of transistors typically involves implanting impurities into semiconductor substrates to form source and drain regions and lightly doped source and drain (LDD) regions. The implanted source and drain regions and LDD regions are then annealed, so that the implanted impurities are activated, and the defects caused by the implantation are reduced.

It was observed that twin boundary defects are often generated in the implanted LDD regions and source and drain regions. The twin boundary defects cause an increase in the leakage currents. Further, in the case the transistors are FinFETs, the twin boundary defects may be propagated to the subsequently formed epitaxy regions.

SUMMARY

In accordance with one aspect of the embodiment, a method of forming an integrated circuit includes providing a semiconductor wafer; and forming a fin field-effect transistor (FinFET) including implanting the semiconductor wafer using a hot-implantation to form an implanted region in the FinFET. The implanted region comprises a region selected from the group consisting essentially of a lightly doped source and drain region, a pocket region, and a deep source drain region.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments and do not limit the scope of the disclosure.

A novel method for forming fin field-effect transistors (FinFETs) is presented. The intermediate stages of manufacturing the embodiment are illustrated. The variations of the embodiment are discussed. Throughout the various views and illustrative embodiments, like reference numbers are used to designate like elements.

Figure 1:
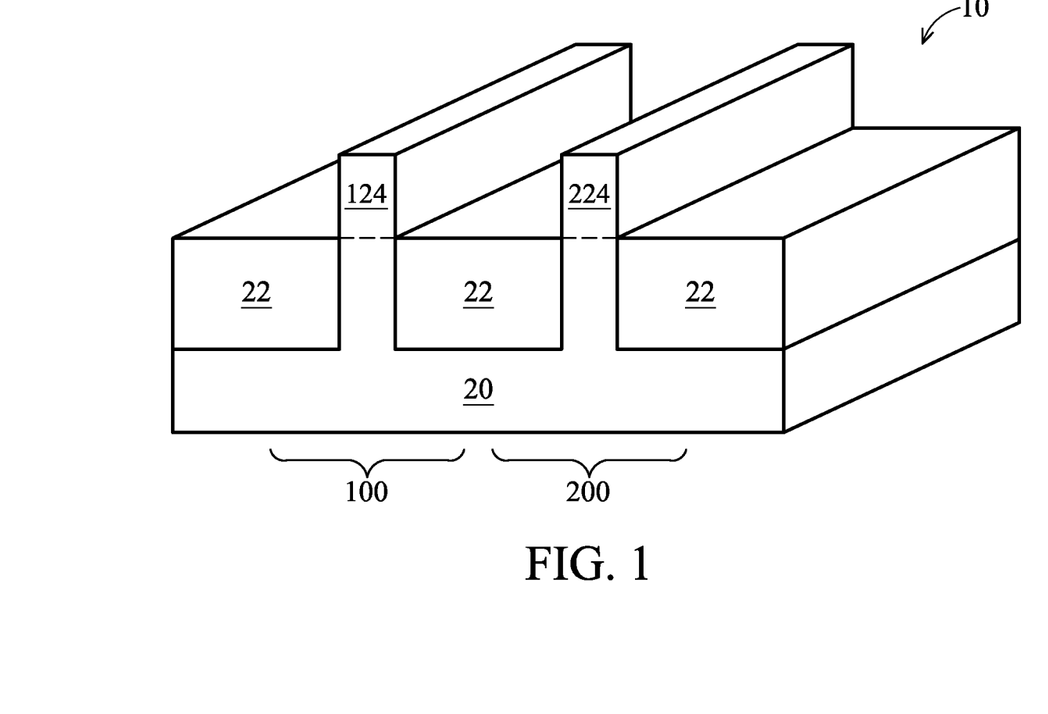
FIGS. 1 through 8 are cross-sectional views and perspective views of intermediate stages in the manufacturing of fin field-effect transistors (FinFETs) in accordance with an embodiment.

Referring to FIG. 1, an integrated circuit structure is formed. The illustrated integrated circuit structure includes a part of wafer 10, which further includes substrate 20. Substrate 20 may be a silicon substrate, a germanium substrate, or a substrate formed of other semiconductor materials. Substrate 20 may be doped with a p-type or an n-type impurity. Isolation regions, such as shallow trench isolation (STI) regions 22, may be formed in or over substrate 20. Semiconductor fins 124 and 224 are formed above the top surfaces of STI regions 22. Substrate 20 includes a portion in NMOS device region 100 and a portion in PMOS device region 200, and semiconductor fins 124 and 224 are in NMOS device region 100 and PMOS device region 200, respectively.

In an exemplary embodiment, semiconductor fins 124 and 224 are formed by forming STI regions 22 first, and then recessing the top surface of STI regions 22 to a level lower than the original top surface of substrate 20. The remaining portions of substrate 20 between STI regions 22 thus become fins 124 and 224. In the embodiments semiconductor fins 124 and 224 are formed of a material different from that of substrate 20. They can be formed by recessing top portions of substrate 20 between neighboring STI regions 22 to form recesses, and re-growing a semiconductor material different from that of substrate 20 in the recesses. Top portions of STI regions 22 may then be removed, while bottom portions of STI regions 22 are not removed, so that the top portions of the re-grown semiconductor material between neighboring STI regions 22 become semiconductor fins. Semiconductor fins 124 and 224 may have channel dopings either introduced through implantations, or through in-situ doping performed simultaneously with the growth of semiconductor fins 124 and 224.

Figure 2:
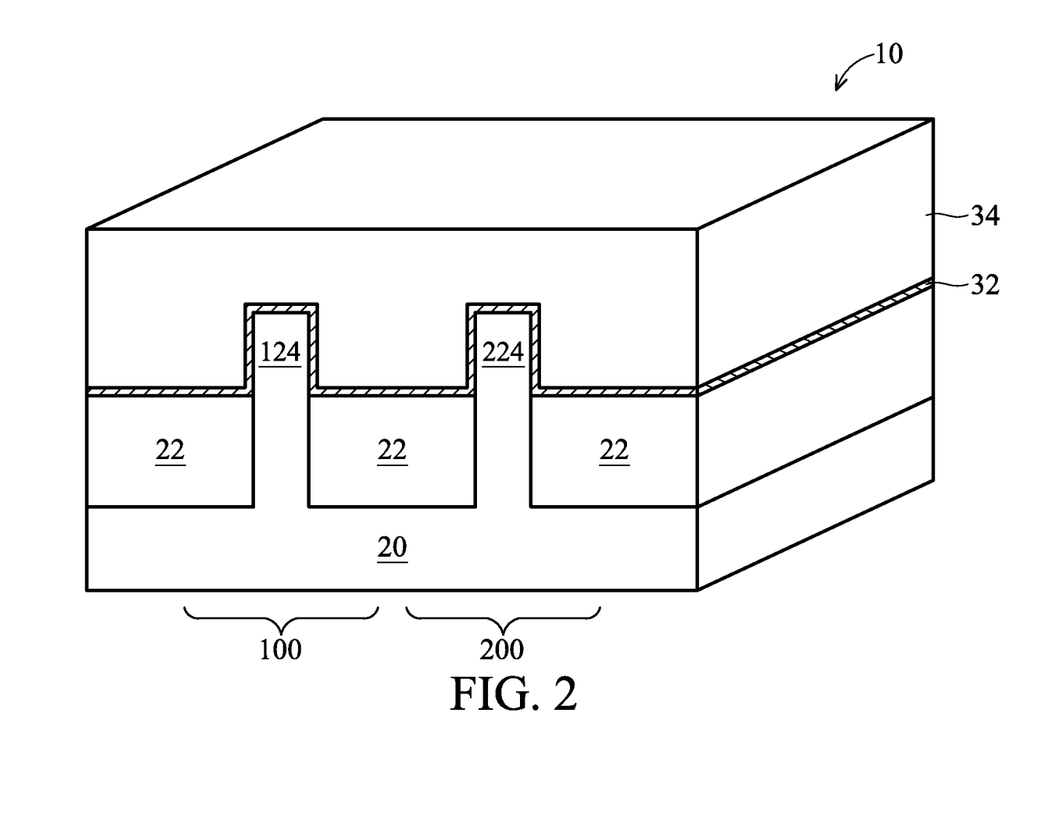

Referring to FIG. 2, gate dielectric layer 32 and gate electrode layer 34 are deposited in both NMOS device region 100 and PMOS device region 200 and over semiconductor fins 124 and 224. In an embodiment, gate dielectric layer 32 is formed of a high-k dielectric material. The exemplary high-k materials may have k values greater than about 4.0, or even greater than about 7.0, and may include aluminum-containing dielectrics, such as $Al_2O_3$, HfAlO, HfAlON, AlZrO, Hf-containing materials, such as $HfO_2$, $HfSiO_x$, $HfAlO_x$, $HfZrSiO_x$, HfSiON, and/or other materials such as $LaAlO_3$ and $ZrO_2$. Gate electrode layer 34 is formed on gate dielectric layer 32 and may be formed of a conductive material, such as doped polysilicon, metals, metal nitrides, or the like.

Figure 3:
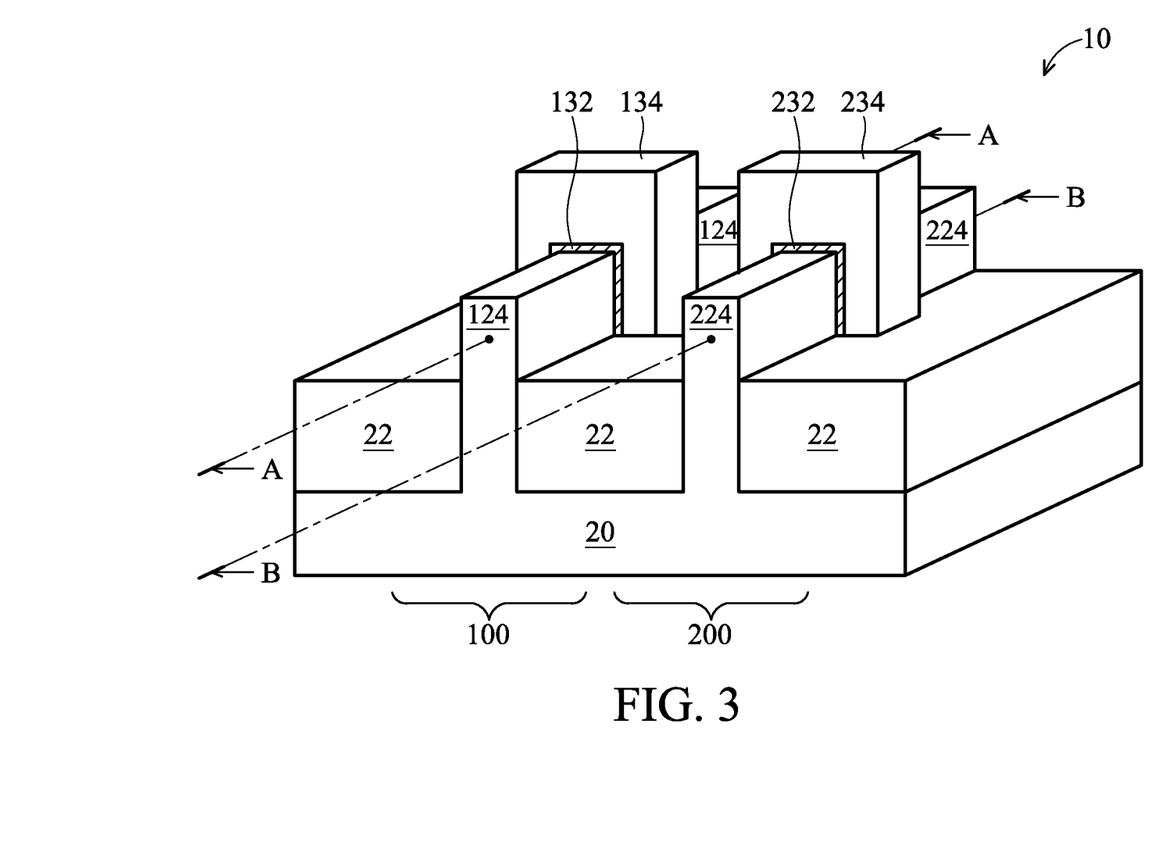

Gate electrode layer 34 and gate dielectric layer 32 are then patterned to form gate stacks, as is shown in FIG. 3. The gate stack in NMOS device region 100 includes gate electrode 134 and gate dielectric 132. The gate stack in PMOS device region 200 includes gate electrode 234 and gate dielectric 232. Each of semiconductor fins 124 and 224 thus has portions that are uncovered by the gate stacks. The exposed portions of semiconductor fins 124 and 224 may be left as they are, so that subsequent pocket and lightly doped source and drain (LDD) regions may be formed by implantation. Alternatively, the exposed portions of semiconductor fins 124 and 224 may be removed to form recesses and semiconductor stressors may be re-grown in the resulting recesses. In an exemplary embodiment, the semiconductor stressors in NMOS device region 100 may comprise silicon carbon (SiC), while the semiconductor stressors in PMOS device region 200 may comprise silicon germanium (SiGe).

Figure 4:
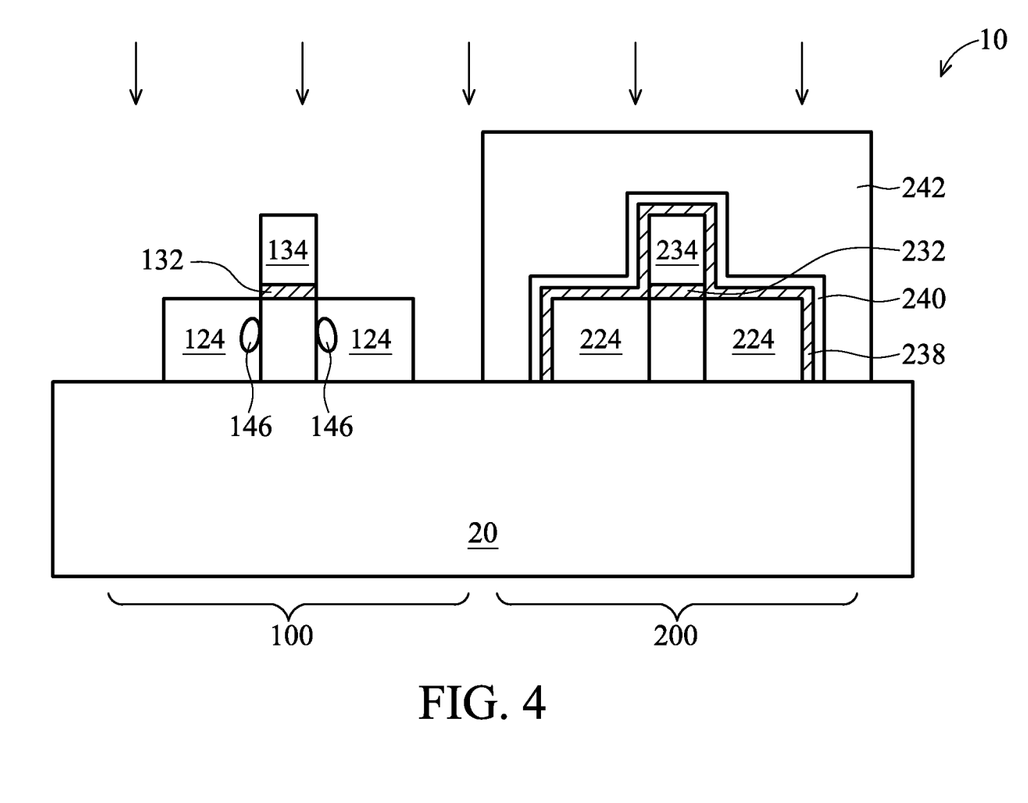

Referring to FIG. 4, hard mask 238, optional bottom anti-reflective coating (BARC) 240, and photo resist 242 are formed. FIG. 4 is a cross-sectional view obtained by combining the cross-sectional views retrieved from the vertical planes crossing lines A-A and B-B in FIG. 3. Hard mask 238 may be formed of a material that can sustain temperatures higher than 150° C., and may sustain temperatures as high as about 750° C., or even higher. In an exemplary embodiment, hard mask 238 is formed of silicon nitride. A patterning is performed to remove the portions of hard mask 238, BARC 240, and photo resist 242 from NMOS device region 100, while PMOS device region 200 is still covered. A pocket implantation is then performed to introduce a p-type impurity into fin 124 to form pocket regions 146. The pocket implantation may be performed at a temperature lower than about 150° C. In an exemplary embodiment, the pocket implantation is performed at room temperature, although the pocket implantation may also be performed at higher temperatures.

Figure 5:
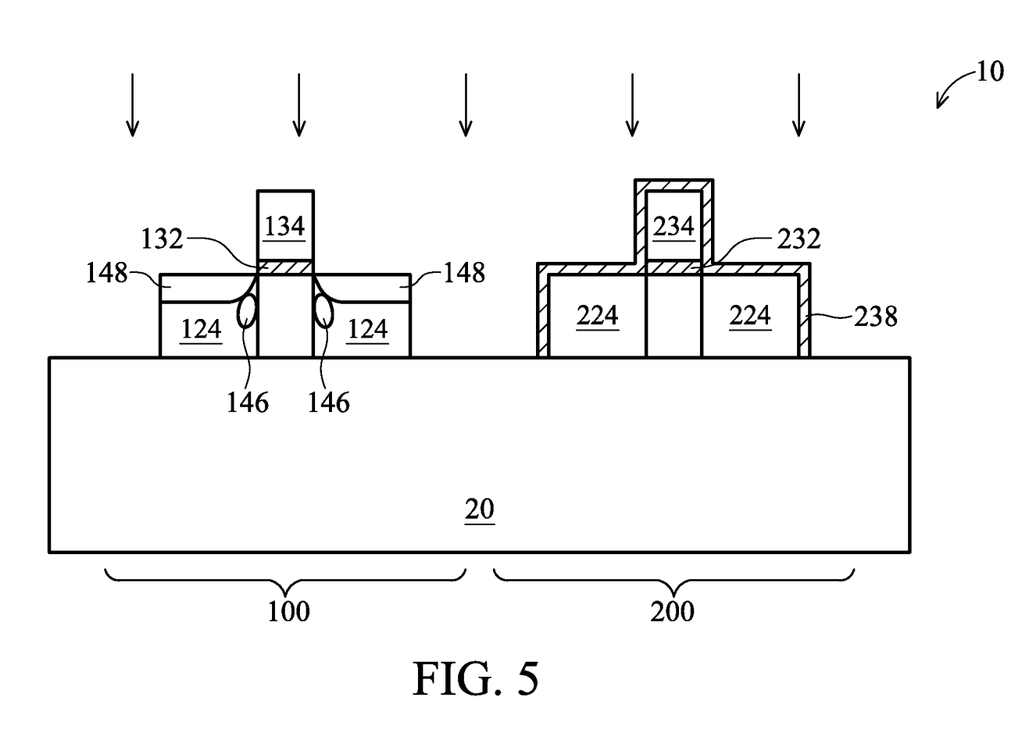
Figure 7:
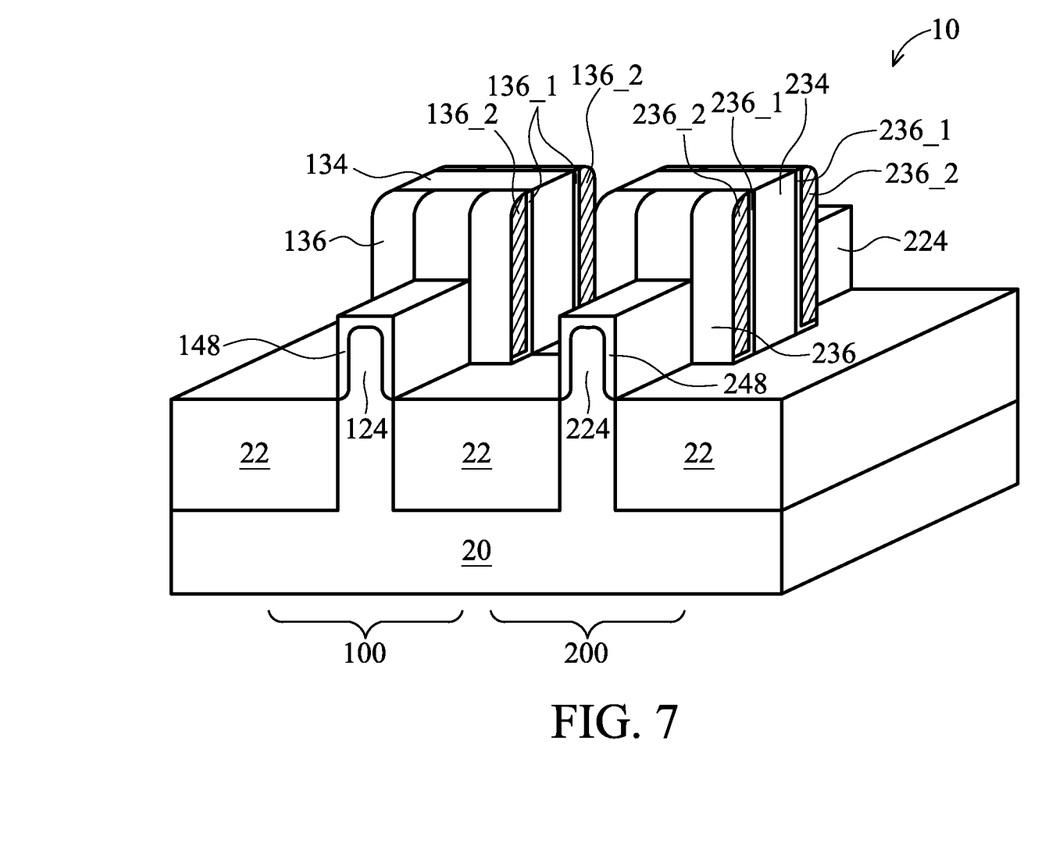

Next, as shown in FIG. 5, photo resist 242 and BARC 240 are removed, while hard mask 238 is left un-removed. An LDD implantation is then performed to introduce an n-type impurity, for example, arsenic or phosphorous. LDD regions 148 are thus formed. Although LDD regions 148 are shown as only being close to the top surface of fin 124, LDD regions 148 may actually be close to both the top surface and sidewalls of fin 124, as shown in FIG. 7. The LDD implantation may be performed vertically, or tilted toward the sidewalls of fin 124 (tilted to left and right in FIG. 7).

The process conditions of the LDD implantation are determined so that after the LDD implantation, the resulting LDD regions 148 are not fully amorphized. In other words, in LDD regions 148, prior to post implant anneal, there are local crystalline structures, which may be distributed substantially throughout LDD regions 148. In an embodiment, the LDD implantation is performed with the implanted regions being at a temperature (which may be referred to as the temperature of wafer 10) higher than 150° C. The temperature of the implanted regions may also be higher than about 300° C., between about 300° C. and about 600° C., or even between about 300° C. and about 750° C. Throughout the description, the implantation during which the wafer temperature is elevated is referred to as a hot-implantation. It is observed that the defect generation rate in implanted LDD regions 148 is related to the temperature of wafer 10. With the hot-implantation for forming LDD regions 148, the defect generation rate is reduced.

With the hot implantation, self-anneal is enhanced in the implanted regions when the LDD implantations proceed. As a result, the amorphization effect caused by the implantation is reduced, and local crystalline structure may be formed throughout LDD regions 148. To enhance the self-anneal effect, the LDD implantation may be performed with a relatively low energy, for example, about 2 keV to about 5 keV. Further, the beam current of the LDD implantation may be reduced, for example, to the minimum allowable value of the implanter used for the LDD implantation, and the scan speed may be increased, for example, to the maximum allowable value of the implanter. Further, phosphorous, which has a smaller mass, may be used instead of arsenic to reduce the amorphization effect. After the formation of LDD regions 148, hard mask 238 is removed.

Figure 6:
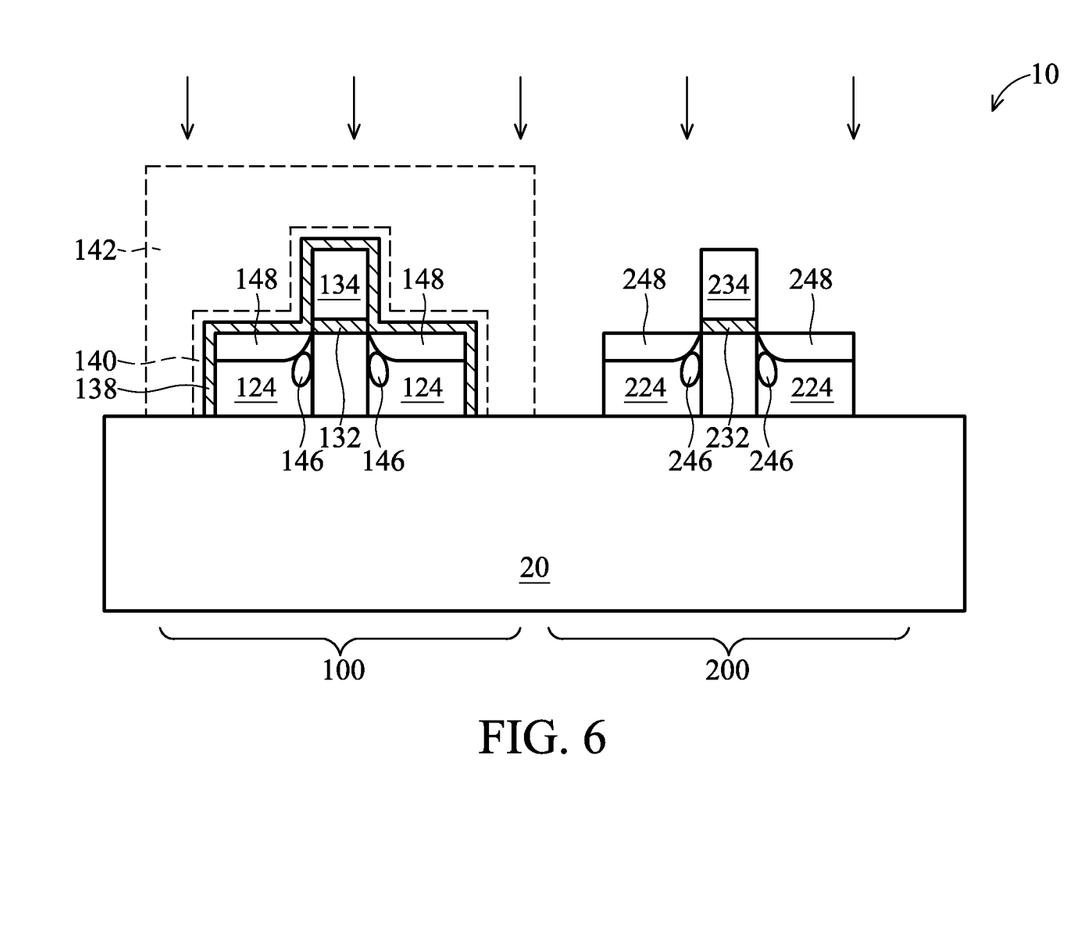

Referring to FIG. 6, pocket regions 246 and LDD regions 248 are formed in PMOS region 200 with the help of hard mask 138, the optional bottom anti-reflective coating (BARC) 140, and photo resist 142. Pocket regions 246 may be formed by implanting an n-type impurity such as phosphorous or arsenic, into fin 224, while LDD regions 248 may be formed by implanting a p-type impurity, such as boron, into fin 224. The materials and the usage of hard mask 138, BARC 140, and photo resist 142 are essentially the same as that of hard mask 238, BARC 240, and photo resist 242 (not shown in FIG. 6, please refer to FIG. 4), respectively, and hence are not repeated herein. Similar to the formation of pocket regions 146 and LDD regions 148, the process steps and temperatures for forming pocket regions 246 and LDD regions 248 may be essentially the same as the temperatures for forming pocket regions 146 and LDD regions 148. Accordingly, LDD regions 248 may be formed using hot-implantation before the removal of hard mask 138, but after the removal of BARC 140 and photo resist 142, while pocket regions 246 may be formed using BARC 140 and photo resist 142 as masks. Hard mask 138 is then removed.

Although in the above-discussed embodiments, pocket regions are described as formed at low temperatures, lower than 150° C., such as room temperature, the hot-implantation may also be performed to form pocket regions 146 and 246. Whether to use hot-implantation to form pocket regions 146 and 246 may partially depend on whether pocket regions 146 and 246 are substantially fully amorphorized without using the hot-implantation. If pocket regions 146 and 246 are substantially fully amorphorized with the room-temperature implantation, then hot-implantation may be used. Otherwise, low temperature implantation or hot-implantation may be used. Again, the hot-implantation temperatures for forming pocket regions 146 and 246 may be essentially the same as for forming LDD regions 148 and 248. However, since photo resists may not be able to stand temperatures higher than about 150° C., when performing the hot-implantation, the pocket implantation may be performed after removing the respective photo resists 142 and 242.

Referring to FIG. 7, gate spacers 136 (denoted as portions 136_1 and 136_2) and 236 (denoted as portions 236_1 and 236_2) may be formed, and an LDD anneal may be performed. In an embodiment, an oxide layer is blanket formed (the blanket oxide layer is not shown in FIG. 7, while gate spacer portions 136_1 and 236_1 are portions of the oxide layer) to cover the structures on wafer 10. The thickness of the oxide layer may be about 40 Å, although a different thickness is also usable. An LDD anneal is then performed. The LDD anneal may be performed at a wafer temperature between about 900° C. and about 1100° C., for example.

In the LDD anneal, since LDD regions 148 and 248 are not fully amorphized, and local crystalline structures still exist in LDD regions 148 and 248, the crystallization in LDD regions 148 and 248 will follow random nucleation instead of solid phase epitaxy (SPE). Since the SPE would have started from the non-amorphized portions of fins 124 and 224 toward amorphized portions of LDD regions 148 and 248, if the SPE occurred, twin boundary defects would have occurred, for example, along the (111) directions of semiconductor fins 124 and 224. However, with the hot-implantation of LDD regions 148 and 248 and the resulting random nucleation, the twin boundary defects were significantly reduced.

The formation of gate spacers 136 and 236 may then continue, which includes blanket forming a silicon nitride layer (the blanket nitride layer is not shown in FIG. 7, while gate spacer portions 136_2 and 236_2 are portions of the silicon nitride layer) on the oxide layer. The horizontal portions of the oxide layer and the silicon nitride layer are then removed, for example, using a dry etch to remove the horizontal portions of the silicon nitride layer, and using HF wet dip to remove the horizontal portions of the oxide layer. The remaining portions of the oxide layer are shown as 136_1 and 236_1, while the remaining portions of the silicon nitride layer is shown as 136_2 and 236_2.

Figure 8:
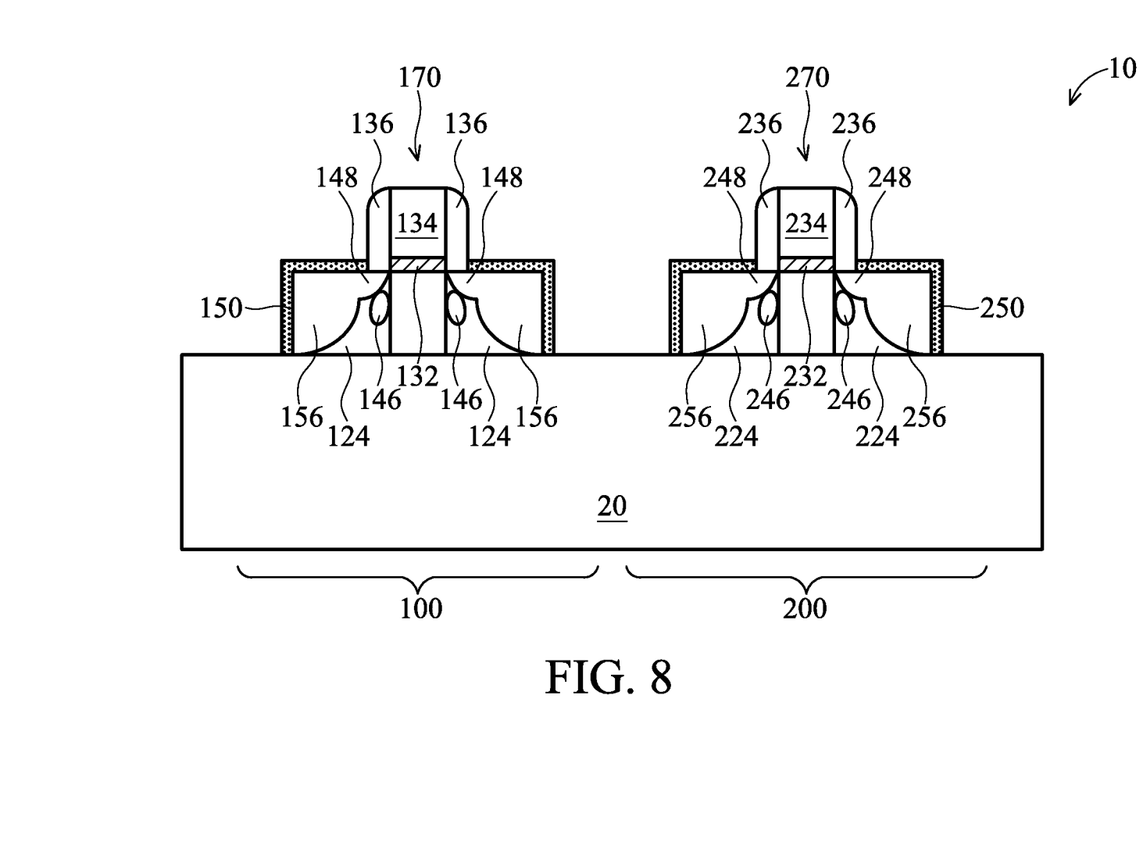

FIG. 8 illustrates the epitaxy formation of epitaxial layers 150 and 250, which are formed on the exposed top surfaces and sidewalls of fins 124 and 224, respectively. Epitaxial layers 150 and 250 may be formed of silicon, silicon germanium, silicon carbon, or the like. It is noted that due to the use of the hot LDD implantation, the LDD anneal may achieve better restoration of the crystalline structure, and fins 124 and 224 may be substantially free from twin boundary defects. Accordingly, substantially no twin boundary defects will be propagated to epitaxial layers 150 and 250. After the formation of epitaxial layers 150 and 250, n-type impurities (such as phosphorous) and p-type impurities (such as boron) may be implanted into fins 124 and 224 and the overlying epitaxial layers 150 and 250, respectively, to form deep source and drain (alternatively referred to as deep source/drain) regions 156 and 256. The impurity concentration in deep source/drain regions 156 and 256 may be between about $1 \times 10^{20}/cm^3$ and about $1 \times 10^{21}/cm^3$, for example.

In an embodiment, the implantations for forming deep source/drain regions 156 and 256 are performed at wafer temperatures higher than 150° C. The temperature of wafer 10 may also be higher than about 300° C., between about 300° C. and about 600° C., or even between about 300° C. and about 750° C. Alternatively, the source and drain implantations are performed at low temperatures, lower than about 150° C., which may be, for example, at room temperature. The implantation steps may be performed similar to those shown in FIGS. 5 and 6, and hence the details are not repeated herein. Again, with the hot source/drain implantation, in the subsequent deep source/drain anneal, random nucleation rather than SPE may occur, and hence the defects in deep source/drain regions 156 and 256 are also significantly reduced.

Next, silicide/germanide regions (not shown) may be formed on deep source/drain regions 156 and 256 by reacting epitaxial layers 150/250 and possibly deep source/drain regions 156 and 256 with a metal(s) to reduce the contact resistances. The formation details of silicide/germanide regions are known in the art, and hence are not repeated herein. Through the above-discussed process steps, NMOS FinFET 170 and PMOS FinFET 270 are formed.

In the embodiments, during the formation of FinFETs, the hot implantation incurs local crystallization in LDD regions and/or deep source/drain regions. Accordingly, the twin boundary defects are significantly reduced. Experiments were performed, in which the hot implantations on blank wafers are used to test the effects of the hot implantations. It was found that when the wafer temperatures are between about 300° C. and about 600° C., significant non-amorphization effect can be observed, and local crystalline structures may remain in the implanted regions. When temperature is close to about 600° C., random nucleation may occur in substantially all LDD regions. Conversely, with the room temperature implantation, the implanted regions may be fully amorphized, and in the subsequent anneal, the twin boundary defects were observed. Experiments were also performed on semiconductor fins, with a similar conclusion drawn.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an integrated circuit, the method comprising:
   providing a semiconductor wafer;
   forming a fin field-effect transistor (FinFET) comprising:
      implanting the semiconductor wafer using a hot-implantation to form an implanted region in the FinFET.
   forming a gate stack on the semiconductor fin; and
   after the hot-implantation, epitaxially growing a semiconductor layer on exposed portions of the semiconductor fin not covered by the gate stack.

2. The method of claim 1, wherein the hot-implantation comprises heating a temperature of the semiconductor wafer to higher than about 150° C.

3. The method of claim 2, wherein the hot-implantation comprises heating the temperature of the semiconductor wafer to higher than about 300° C.

4. The method of claim 3, wherein the hot-implantation comprises heating the temperature of the semiconductor wafer to between about 300° C. and about 600° C.

5. The method of claim 1, wherein the implanted region comprises a lightly doped source/drain region of the FinFET.

6. The method of claim 1, wherein the implanted region comprises a pocket region of the FinFET.

7. The method of claim 1, wherein the implanted region comprises a deep source/drain region of the FinFET.

8. A method of forming an integrated circuit, the method comprising:
   providing a semiconductor wafer; and
   forming a fin field-effect transistor (FinFET) comprising:
      forming a semiconductor fin on the semiconductor wafer;
      forming a gate stack on the semiconductor fin;
      performing a hot-implantation to form an implanted region adjacent the gate stack at a wafer temperature higher than about 300° C., wherein the step of performing the hot implantation is selected from the group consisting essentially of:
         implanting the semiconductor wafer to form a lightly-doped source/drain region;
         implanting the semiconductor wafer to form a pocket region; and implanting the semiconductor wafer to form a deep source/drain region; and
      after the hot-implantation, epitaxially growing a semiconductor layer on exposed portions of the semiconductor fin not covered by the gate stack.

9. The method of claim 8, wherein the hot-implantation comprises the step of implanting the semiconductor wafer to form the lightly-doped source/drain region.

10. The method of claim 9, wherein the step of forming the pocket region is performed at a wafer temperature lower than 150° C.

11. The method of claim 9, wherein the step of forming the deep source/drain region is performed at a wafer temperature lower than about 150° C.

12. The method of claim 8, wherein the hot-implantation comprises the step of implanting the semiconductor wafer to form the deep source/drain region.

13. The method of claim 8, wherein the hot-implantation comprises the step of implanting the semiconductor wafer to form the lightly-doped source/drain region, and the step of implanting the semiconductor wafer to form the deep source/drain region.

14. The method of claim 8, wherein the wafer temperature is between about 300° C. and 600° C.

15. A method of forming an integrated circuit, the method comprising:
provided a semiconductor wafer;
forming a first semiconductor fin and a second semiconductor fin on the semiconductor wafer, wherein the first semiconductor fin is in a first device region and the second semiconductor fin is in a second device region, and wherein one of the first device region and second device region is a PMOS region, and the other is an NMOS device region;
forming a first gate stack on a top surface and sidewalls of the first semiconductor fin;
forming a second gate stack on a top surface and sidewalls of the second semiconductor fin;
forming a first hard mask and a first photo resist over the first hard mask to cover the second gate stack and the second semiconductor fin, wherein the first hard mask and the first photo resist do not cover the first gate stack and the first semiconductor fin;
performing a first pocket implantation to form a first pocket region in the first semiconductor fin at a first wafer temperature lower than 150° C.;
removing the first photo resist without removing the first hard mask; and performing a first hot-implantation using the first hard mask to form a first lightly doped source and drain (LDD) region in the first semiconductor fin at a second wafer temperature higher than about 300° C.; and
removing the first hard mask from the second device region.

16. The method of claim 15 further comprising:
forming a second hard mask and a second photo resist over the second hard mask to cover the first gate stack and the first semiconductor fin, wherein the second hard mask and the second photo resist do not cover the second gate stack and the second semiconductor fin;
performing a second pocket implantation to form a second pocket region in the second semiconductor fin at a third wafer temperature lower than 150° C.;
removing the second photo resist without removing the second hard mask; and
performing a hot-implantation using the second hard mask to form a second LDD region in the second semiconductor fin at a fourth wafer temperature higher than about 300° C.

17. The method of claim 16, wherein the second wafer temperature and the fourth wafer temperature are between about 300° C. and about 600° C.

18. The method of claim 15 further comprising performing a hot-implantation to form a deep source/drain region in the first semiconductor fin at a wafer temperature higher than about 300° C.

* * * * *